(12) United States Patent
Yamada

(10) Patent No.: US 9,356,575 B2
(45) Date of Patent: May 31, 2016

(54) RESONATOR ELEMENT, RESONATOR, OSCILLATOR, ELECTRONIC DEVICE AND MOBILE OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/540,578

(22) Filed: Nov. 13, 2014

(65) Prior Publication Data

US 2015/0137899 A1 May 21, 2015

(30) Foreign Application Priority Data

Nov. 16, 2013 (JP) ................................ 2013-237475

(51) Int. Cl.
| | |
|---|---|
| *H03B 5/32* | (2006.01) |
| *H01L 41/053* | (2006.01) |
| *H03H 9/215* | (2006.01) |
| *H03H 3/04* | (2006.01) |
| *H03H 9/02* | (2006.01) |
| *H03H 9/05* | (2006.01) |

(52) U.S. Cl.
CPC ............ *H03H 9/215* (2013.01); *H01L 41/053* (2013.01); *H03B 5/32* (2013.01); *H03H 3/04* (2013.01); *H03H 9/02157* (2013.01); *H03H 9/0547* (2013.01); *H03H 2003/0407* (2013.01)

(58) Field of Classification Search
CPC ............ G06F 5/04; G06F 5/06; G06F 5/063; H01L 41/053; H03B 5/30; H03B 5/32; H03H 9/15; H03H 9/17; H03H 9/19; H03H 9/21; H03H 9/215; H03H 9/2468; H03H 9/2473; H03H 9/2478; H03H 9/2484; H03H 9/2489; H03H 9/2494; H03H 2003/026; H03H 2003/0492
USPC .......... 310/311, 312, 348, 370; 331/154, 156, 331/158
See application file for complete search history.

(56) References Cited

U.S. PATENT DOCUMENTS

| | | |
|---|---|---|
| 2006/0066185 A1 | 3/2006 | Tanaya |
| 2007/0007864 A1 | 1/2007 | Tanaya |
| 2008/0211350 A1 | 9/2008 | Tanaya et al. |
| 2011/0156831 A1 | 6/2011 | Tanaya et al. |
| 2013/0208573 A1 | 8/2013 | Arimatsu |

FOREIGN PATENT DOCUMENTS

| | | |
|---|---|---|
| JP | A-2006-121505 | 5/2006 |
| JP | A-2006-311090 | 11/2006 |
| JP | A-2007-13391 | 1/2007 |

(Continued)

*Primary Examiner* — Levi Gannon
(74) *Attorney, Agent, or Firm* — Oliff PLC

(57) ABSTRACT

A resonator element includes a quartz crystal resonator blank provided with a base portion, vibrating arms extending from one end side of the base portion, a connecting portion which is disposed on the other end side of the base portion, and a coupling portion, located between the base portion and the connecting portion, which couples the base portion to the connecting portion. When a thickness of the quartz crystal resonator blank is set to T, a width of the base portion is set to W1, and a width of the coupling portion is set to W2, a relation of 110 μm≤T≤210 μm is satisfied, and a relation of 0.469≤W2/W1≤0.871 is satisfied.

17 Claims, 20 Drawing Sheets

(56) References Cited

FOREIGN PATENT DOCUMENTS

| JP | A-2007-81570 | 3/2007 |
| JP | A-2008-48274 | 2/2008 |
| JP | A-2008-48275 | 2/2008 |
| JP | A-2008-72705 | 3/2008 |
| JP | A-2008-136095 | 6/2008 |
| JP | A-2009-253622 | 10/2009 |
| JP | A-2011-151780 | 8/2011 |
| JP | A-2012-161104 | 8/2012 |
| JP | A-2013-17207 | 1/2013 |
| JP | A-2013-70380 | 4/2013 |
| JP | A-2013-165455 | 8/2013 |
| JP | A-2013-229733 | 11/2013 |

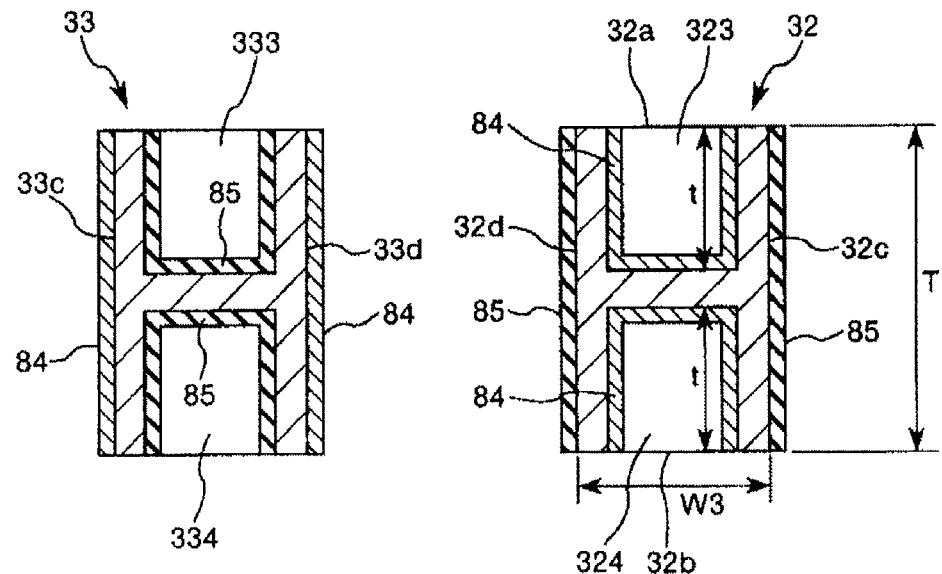
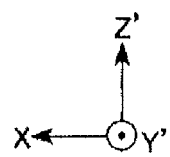
FIG. 3

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 50 | 20 | 0.067 | 21410.9 | 4.3 | 0.75 |
|  | 40 | 0.134 | 12482.2 | 4.1 | 0.79 |
|  | 60 | 0.201 | 8416.9 | 3.9 | 0.82 |
|  | 80 | 0.268 | 7122.9 | 3.9 | 0.84 |
|  | 100 | 0.335 | 6111.3 | 3.8 | 0.85 |
|  | 140 | 0.469 | 4917.9 | 3.7 | 0.87 |
|  | 180 | 0.603 | 4456.9 | 3.6 | 0.88 |
|  | 220 | 0.737 | 3761.2 | 3.6 | 0.90 |
|  | 260 | 0.871 | 3432.5 | 3.5 | 0.91 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 60 | 20 | 0.067 | 18000.4 | 4.3 | 0.76 |
|  | 40 | 0.134 | 10443.7 | 4.0 | 0.80 |
|  | 60 | 0.201 | 7642.7 | 3.9 | 0.83 |
|  | 80 | 0.268 | 6474.7 | 3.8 | 0.85 |
|  | 100 | 0.335 | 5480.1 | 3.7 | 0.86 |
|  | 140 | 0.469 | 4286.3 | 3.6 | 0.89 |
|  | 180 | 0.603 | 3691.2 | 3.6 | 0.90 |
|  | 220 | 0.737 | 3436.7 | 3.5 | 0.91 |
|  | 260 | 0.871 | 3053.4 | 3.5 | 0.93 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 70 | 20 | 0.067 | 15966.0 | 4.2 | 0.77 |
|  | 40 | 0.134 | 9610.9 | 4.0 | 0.81 |
|  | 60 | 0.201 | 6694.1 | 3.8 | 0.84 |
|  | 80 | 0.268 | 5382.6 | 3.7 | 0.87 |
|  | 100 | 0.335 | 4775.7 | 3.7 | 0.88 |
|  | 140 | 0.469 | 3872.4 | 3.6 | 0.91 |
|  | 180 | 0.603 | 3332.3 | 3.5 | 0.92 |
|  | 220 | 0.737 | 2991.3 | 3.5 | 0.93 |
|  | 260 | 0.871 | 2774.4 | 3.4 | 0.94 |

FIG. 10

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 80 | 20 | 0.067 | 13191.0 | 4.1 | 0.78 |
| | 40 | 0.134 | 8039.9 | 3.9 | 0.83 |
| | 60 | 0.201 | 6074.3 | 3.8 | 0.85 |
| | 80 | 0.268 | 5007.5 | 3.7 | 0.87 |
| | 100 | 0.335 | 4320.3 | 3.6 | 0.89 |
| | 140 | 0.469 | 3603.7 | 3.6 | 0.91 |
| | 180 | 0.603 | 3142.8 | 3.5 | 0.92 |
| | 220 | 0.737 | 2690.1 | 3.4 | 0.94 |
| | 260 | 0.871 | 2485.3 | 3.4 | 0.95 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 100 | 20 | 0.067 | 10594.1 | 4.0 | 0.80 |
| | 40 | 0.134 | 6455.8 | 3.8 | 0.85 |
| | 60 | 0.201 | 4896.6 | 3.7 | 0.87 |
| | 80 | 0.268 | 4229.8 | 3.6 | 0.89 |
| | 100 | 0.335 | 3684.4 | 3.6 | 0.90 |
| | 140 | 0.469 | 3049.9 | 3.5 | 0.93 |
| | 180 | 0.603 | 2650.4 | 3.4 | 0.94 |
| | 220 | 0.737 | 2341.4 | 3.4 | 0.96 |
| | 260 | 0.871 | 2321.3 | 3.4 | 0.96 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 110 | 20 | 0.067 | 9530.7 | 4.0 | 0.81 |
| | 40 | 0.134 | 5794.5 | 3.8 | 0.86 |
| | 60 | 0.201 | 4353.1 | 3.7 | 0.88 |
| | 80 | 0.268 | 3863.3 | 3.6 | 0.90 |
| | 100 | 0.335 | 3396.8 | 3.5 | 0.91 |
| | 140 | 0.469 | 2855.7 | 3.5 | 0.93 |
| | 180 | 0.603 | 2585.5 | 3.4 | 0.95 |
| | 220 | 0.737 | 2291.2 | 3.4 | 0.96 |
| | 260 | 0.871 | 2102.7 | 3.3 | 0.97 |

FIG. 11

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 120 | 20 | 0.067 | 8841.5 | 3.9 | 0.82 |
| | 40 | 0.134 | 5477.8 | 3.7 | 0.86 |
| | 60 | 0.201 | 4260.3 | 3.6 | 0.89 |
| | 80 | 0.268 | 3602.4 | 3.6 | 0.91 |
| | 100 | 0.335 | 3309.4 | 3.5 | 0.92 |
| | 140 | 0.469 | 2754.7 | 3.4 | 0.94 |
| | 180 | 0.603 | 2481.1 | 3.4 | 0.95 |
| | 220 | 0.737 | 2261.8 | 3.4 | 0.96 |
| | 260 | 0.871 | 1984.6 | 3.3 | 0.98 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 130 | 20 | 0.067 | 8236.0 | 3.9 | 0.82 |
| | 40 | 0.134 | 5150.2 | 3.7 | 0.87 |
| | 60 | 0.201 | 3966.3 | 3.6 | 0.90 |
| | 80 | 0.268 | 3213.9 | 3.5 | 0.92 |
| | 100 | 0.335 | 3141.2 | 3.5 | 0.92 |
| | 140 | 0.469 | 2651.1 | 3.4 | 0.94 |
| | 180 | 0.603 | 2247.9 | 3.4 | 0.96 |
| | 220 | 0.737 | 2121.0 | 3.3 | 0.97 |
| | 260 | 0.871 | 1973.2 | 3.3 | 0.98 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 140 | 20 | 0.067 | 7571.7 | 3.9 | 0.83 |
| | 40 | 0.134 | 4562.4 | 3.7 | 0.88 |
| | 60 | 0.201 | 3725.0 | 3.6 | 0.90 |
| | 80 | 0.268 | 3422.1 | 3.5 | 0.91 |
| | 100 | 0.335 | 2849.9 | 3.5 | 0.93 |
| | 140 | 0.469 | 2545.6 | 3.4 | 0.95 |
| | 180 | 0.603 | 2349.0 | 3.4 | 0.96 |
| | 220 | 0.737 | 2179.1 | 3.3 | 0.97 |
| | 260 | 0.871 | 1883.7 | 3.3 | 0.99 |

FIG. 12

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 150 | 20 | 0.067 | 7057.5 | 3.8 | 0.84 |
|  | 40 | 0.134 | 4476.9 | 3.7 | 0.88 |
|  | 60 | 0.201 | 3433.6 | 3.5 | 0.91 |
|  | 80 | 0.268 | 2967.1 | 3.5 | 0.93 |
|  | 100 | 0.335 | 2779.5 | 3.4 | 0.94 |
|  | 140 | 0.469 | 2488.8 | 3.4 | 0.95 |
|  | 180 | 0.603 | 2136.3 | 3.3 | 0.97 |
|  | 220 | 0.737 | 2095.3 | 3.3 | 0.97 |
|  | 260 | 0.871 | 1949.0 | 3.3 | 0.98 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 190 | 20 | 0.067 | 5724.9 | 3.8 | 0.86 |
|  | 40 | 0.134 | 3430.0 | 3.5 | 0.91 |
|  | 60 | 0.201 | 2902.3 | 3.5 | 0.93 |
|  | 80 | 0.268 | 2577.3 | 3.4 | 0.95 |
|  | 100 | 0.335 | 2485.5 | 3.4 | 0.95 |
|  | 140 | 0.469 | 2231.5 | 3.3 | 0.96 |
|  | 180 | 0.603 | 2105.9 | 3.3 | 0.97 |
|  | 220 | 0.737 | 1827.6 | 3.3 | 0.99 |
|  | 260 | 0.871 | 1758.3 | 3.2 | 0.99 |

| THICKNESS OF PLATE [μm] | SWINGING WIDTH W2 [μm] | SWINGING WIDTH RATE W2/W1 | FIRST PRIMARY STRESS [Pa] | log (FIRST PRIMARY STRESS) [Pa] | IMPACT RESISTANCE INDEX |
|---|---|---|---|---|---|
| 210 | 20 | 0.067 | 5262.6 | 3.7 | 0.87 |
|  | 40 | 0.134 | 3185.2 | 3.5 | 0.92 |
|  | 60 | 0.201 | 2548.5 | 3.4 | 0.95 |
|  | 80 | 0.268 | 2316.9 | 3.4 | 0.96 |
|  | 100 | 0.335 | 2199.9 | 3.3 | 0.97 |
|  | 140 | 0.469 | 2194.9 | 3.3 | 0.97 |
|  | 180 | 0.603 | 1932.9 | 3.3 | 0.98 |
|  | 220 | 0.737 | 1910.5 | 3.3 | 0.98 |
|  | 260 | 0.871 | 1690.8 | 3.2 | 1.00 |

FIG. 13

RESONATOR ELEMENT, RESONATOR, OSCILLATOR, ELECTRONIC DEVICE AND MOBILE OBJECT

BACKGROUND

1. Technical Field

The present invention relates to a resonator element, a resonator, an oscillator, an electronic device and a mobile object.

2. Related Art

Hitherto, resonator elements using a quartz crystal have been known. Such resonator elements have excellent frequency-temperature characteristics, and thus have been widely used as a reference frequency source or a transmission source of various electronic devices.

A resonator element disclosed in JP-A-2008-72705 is formed in a tuning fork type, and includes a resonator blank provided with a base portion, a pair of vibrating arms extending from one end side of the base portion, a connecting portion which is located on the other end side of the base portion, a coupling portion, located between the base portion and the connecting portion, which couples the base portion to the connecting portion, and a support arm extending from the connecting portion.

Such JP-A-2008-72705 discloses that e/r which is a ratio between a width r of the coupling portion and a width e of the base portion is preferably equal to or less than 40%, and is more preferably 23% to 40%. As an effect of satisfying such ranges, the above document discloses a technique capable of maintaining impact resistance while suppressing vibration leakage. However, even when e/r satisfies the above relation, the impact resistance is not able to be maintained depending on design conditions (for example, thickness of a resonator blank), and thus the resonator element may have a tendency to be broken. In addition, JP-A-2008-72705 discloses that the thickness of the resonator blank is preferably 70 μm to 130 μm (see paragraph 0042 of JP-A-2008-72705), but the relationship between the thickness and e/r is not obvious.

SUMMARY

An advantage of some aspects of the invention is to provide a resonator element having excellent impact resistance while reducing vibration leakage, a resonator, an oscillator, an electronic device and a mobile object having high reliability which are provided with the resonator element.

The invention can be implemented as the following application examples.

APPLICATION EXAMPLE 1

A resonator element according to this application example includes a resonator blank which is provided with: a base portion; a vibrating arm that extends out in a first direction from one end side of the base portion, when seen in plan view; a connecting portion which is disposed on the other end side of the base portion, when seen in plan view; and a coupling portion, located between the base portion and the connecting portion when seen in plan view, which couples the base portion to the connecting portion, wherein when a thickness of the resonator blank is set to T, a width of the base portion along a second direction intersecting the first direction is set to W1, and a width of the coupling portion along the second direction is set to W2, a relation of 110 μm≤T≤210 μm is satisfied, and a relation of 0.469≤W2/W1≤0.871 is satisfied.

With this configuration, it is possible to provide a resonator element having both excellent vibration characteristics and excellent impact resistance.

APPLICATION EXAMPLE 2

In the resonator element according to the application example described above, it is preferable that a relation of 130 μm≤T≤210 μm is satisfied.

With this configuration, it is possible to provide a resonator element having both more excellent vibration characteristics and more excellent impact resistance.

APPLICATION EXAMPLE 3

A resonator element according to this application example includes a resonator blank which is provided with: a base portion; a vibrating arm that extends out in a first direction from one end side of the base portion, when seen in plan view; a connecting portion which is disposed on the other end side of the base portion, when seen in plan view; and a coupling portion, located between the base portion and the connecting portion when seen in plan view, which couples the base portion to the connecting portion, wherein when a thickness of the resonator blank is set to T, a width of the base portion along a second direction intersecting the first direction is set to W1, and a width of the coupling portion along the second direction is set to W2, a relation of 150 μm<T≤210 μm is satisfied, and a relation of 0.268≤W2/W1≤0.335 is satisfied.

With this configuration, it is possible to provide a resonator element having both excellent vibration characteristics and excellent impact resistance.

APPLICATION EXAMPLE 4

In the resonator element according to the application example described above, it is preferable that the connecting portion extends out along the second direction, and the resonator element further includes a support arm connected to the connecting portion, which extends out along the first direction.

With this configuration, for example, it is possible to fix the resonator element to a base through the support arm, and to increase a separation distance (vibration propagation distance) between the fixing portion and the vibrating arm. Therefore, it is possible to effectively reduce the vibration leakage of the resonator element.

APPLICATION EXAMPLE 5

In the resonator element according to the application example described above, it is preferable that the vibrating arm includes: a weight portion; and an arm which is disposed between the base portion and the weight portion, when seen in plan view.

With this configuration, it is possible to achieve a reduction in the size of the resonator element and an improvement in vibration characteristics.

APPLICATION EXAMPLE 6

In the resonator element according to the application example described above, it is preferable that a groove is provided in at least one of a first main surface and a second main surface of the vibrating arm which have a front-back relationship with each other.

With this configuration, it is possible to improve vibration characteristics.

APPLICATION EXAMPLE 7

A resonator according to this application example includes: the resonator element according to the application described above; and a package in which the resonator element is stored.

With this configuration, it is possible to obtain a resonator having high reliability.

APPLICATION EXAMPLE 8

An oscillator according to this application example includes: the resonator element according to the application example described above; and a circuit.

With this configuration, it is possible to obtain an oscillator having high reliability.

APPLICATION EXAMPLE 9

An electronic device according to this application example includes the resonator element according to the application example described above.

With this configuration, it is possible to obtain an electronic device having high reliability.

APPLICATION EXAMPLE 10

A mobile object according to this application example includes the resonator element according to the application example described above.

With this configuration, it is possible to obtain a mobile object having high reliability.

BRIEF DESCRIPTION OF THE DRAWINGS

The invention will be described with reference to the accompanying drawings, wherein like numbers reference like elements.

FIG. 3 is a cross-sectional view taken along line B-B of FIG. 1.

FIG. 10 is a table illustrating simulation results.
FIG. 11 is a table illustrating simulation results.
FIG. 12 is a table illustrating simulation results.
FIG. 13 is a table illustrating simulation results.

DESCRIPTION OF EXEMPLARY EMBODIMENTS

Hereinafter, a resonator element, a resonator, an oscillator, an electronic device and a mobile object according to the invention will be described in detail on the basis of preferred embodiments shown in the accompanying drawings.

1. Resonator

First, a resonator according to the invention will be described.

Figure 1:
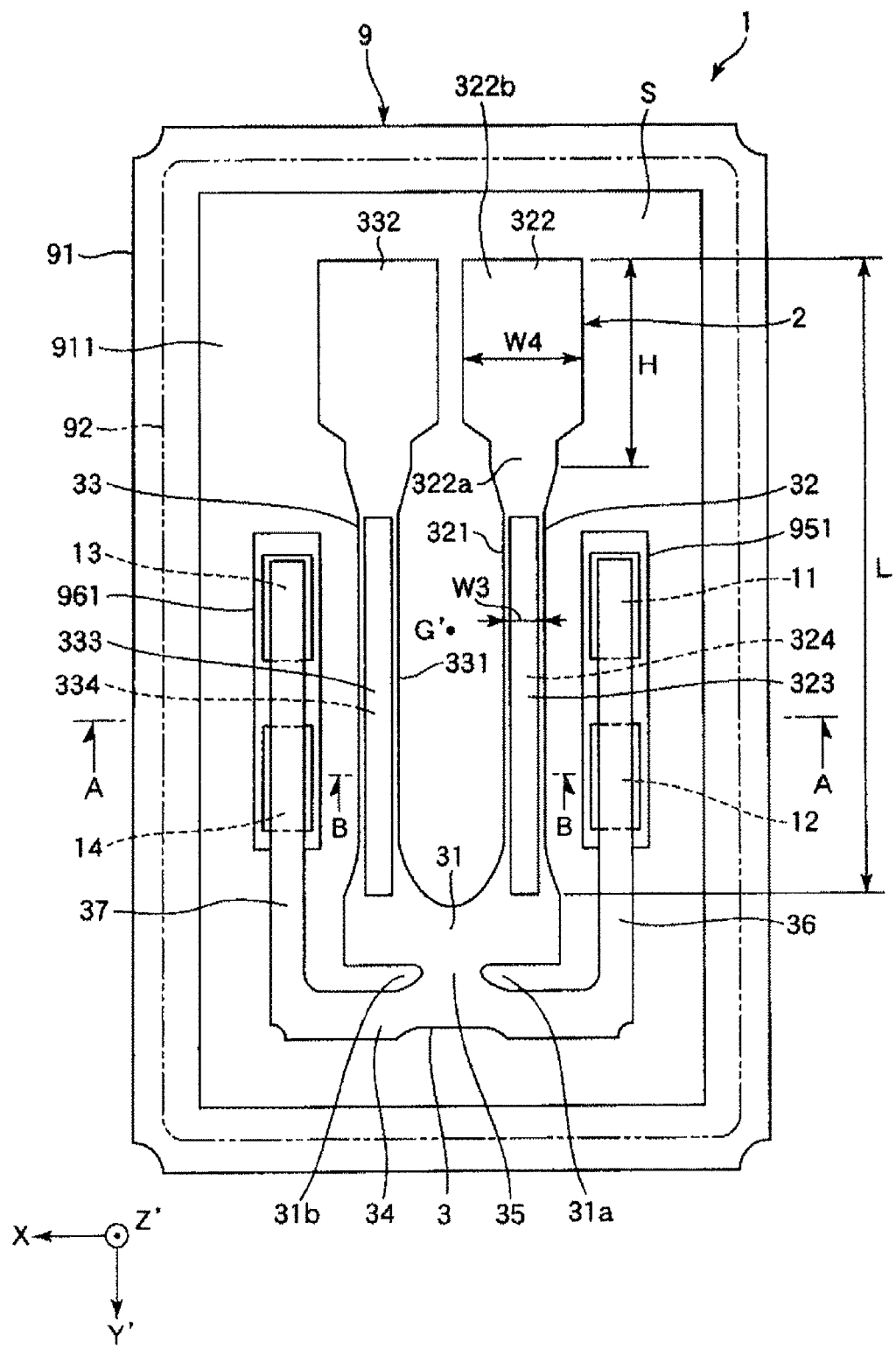
FIG. 1 is a plan view illustrating a resonator according to a preferred embodiment of the invention.
Figure 2:
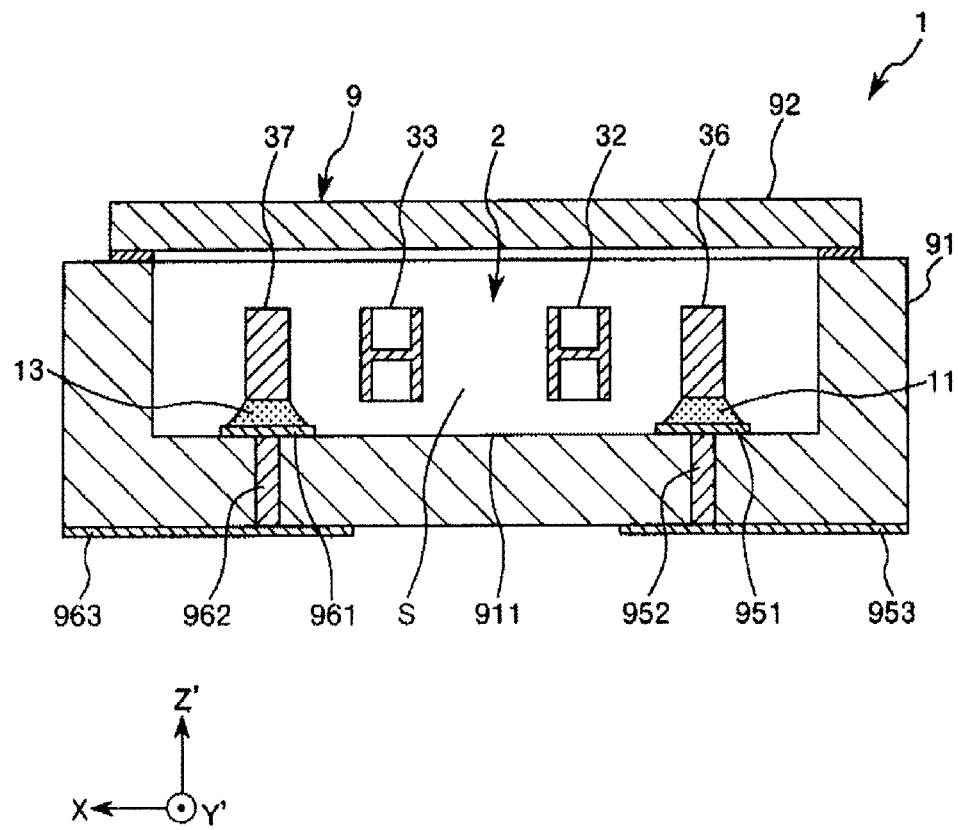
FIG. 2 is a cross-sectional view taken along line A-A of FIG. 1.
Figure 4:
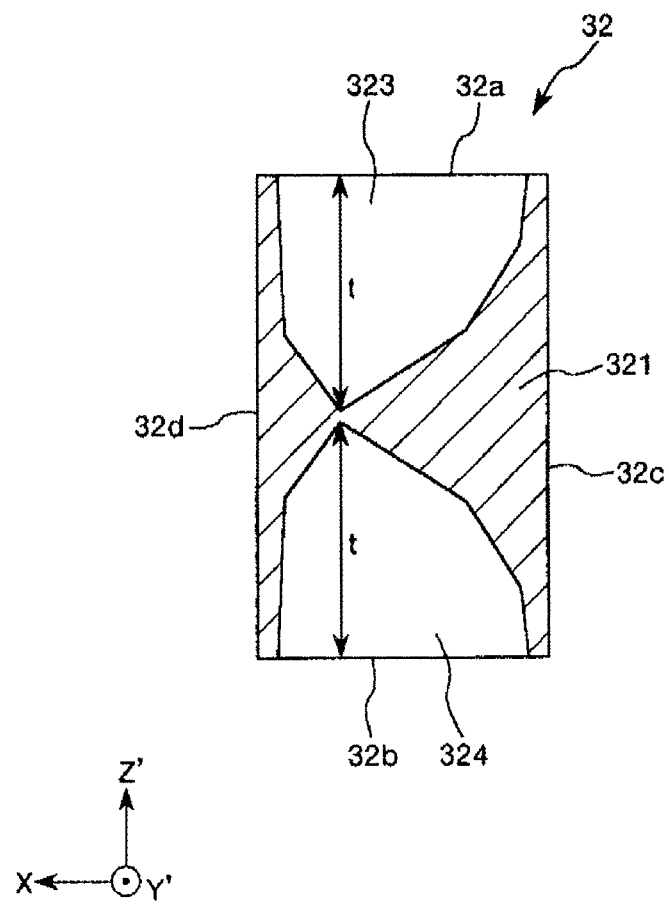
FIG. 4 is a cross-sectional view illustrating a vibrating arm formed by wet etching.
Figure 5:
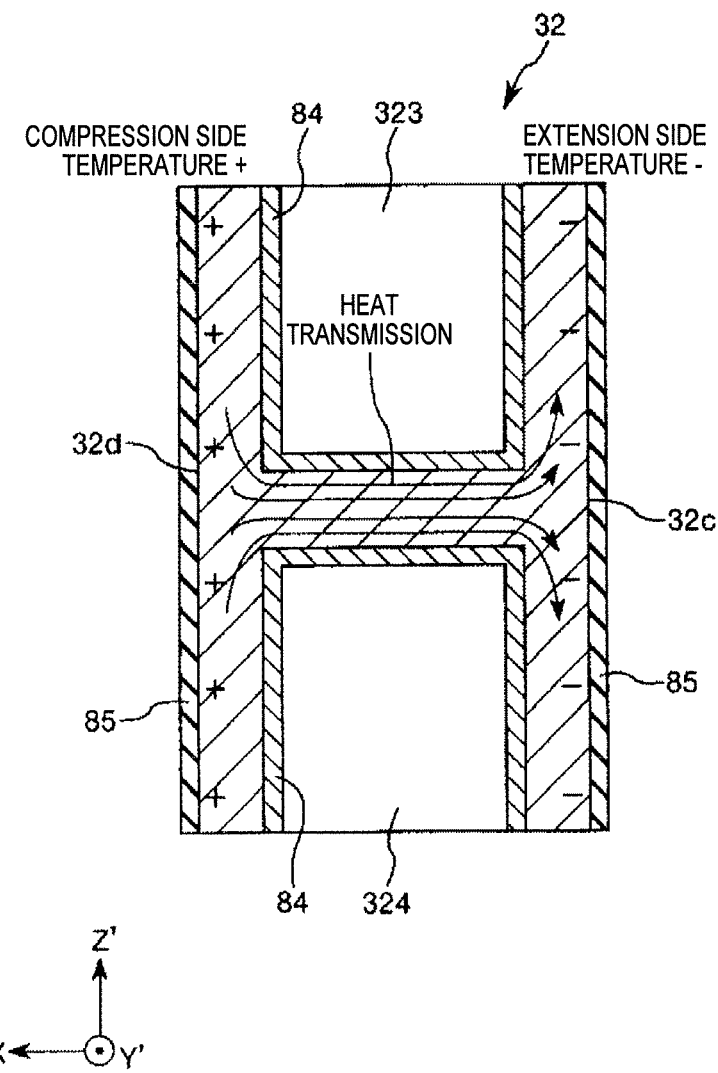
FIG. 5 is a cross-sectional view illustrating a vibrating arm regarding thermal conduction during flexural vibration.
Figure 6:
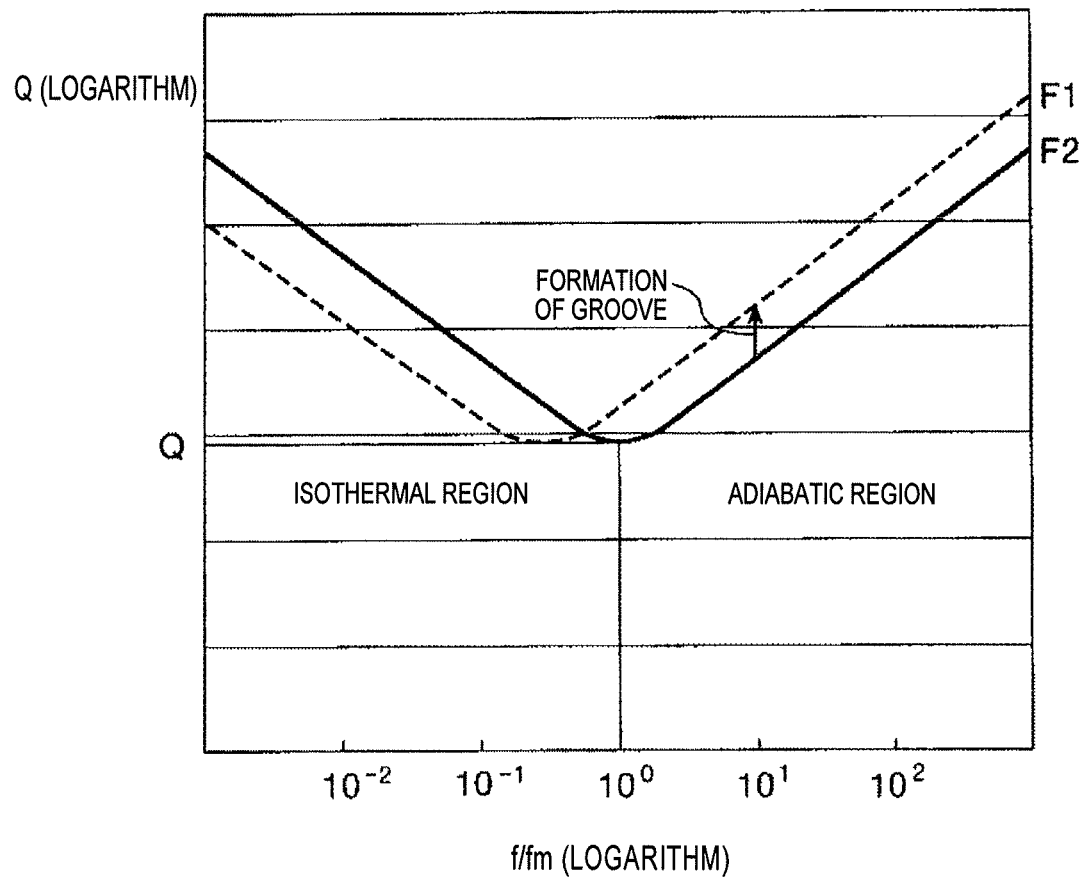
FIG. 6 is a graph illustrating a relationship between a Q value and f/fm.
Figure 7:
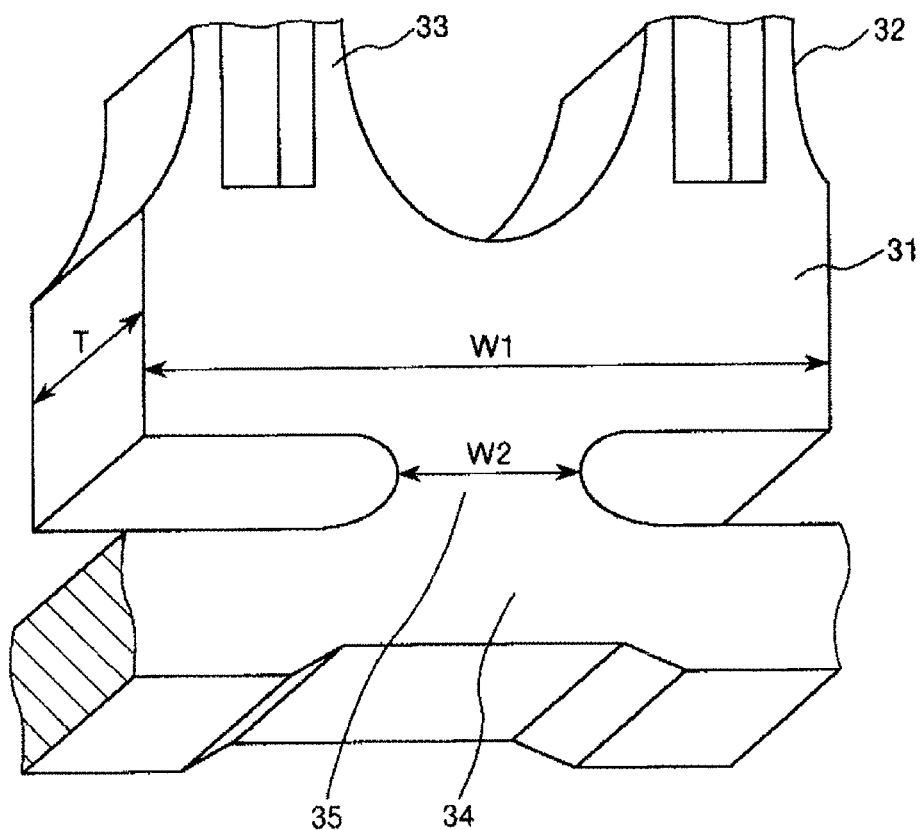
FIG. 7 is a perspective view illustrating a thickness T, and widths W1 and W2.
Figure 8:
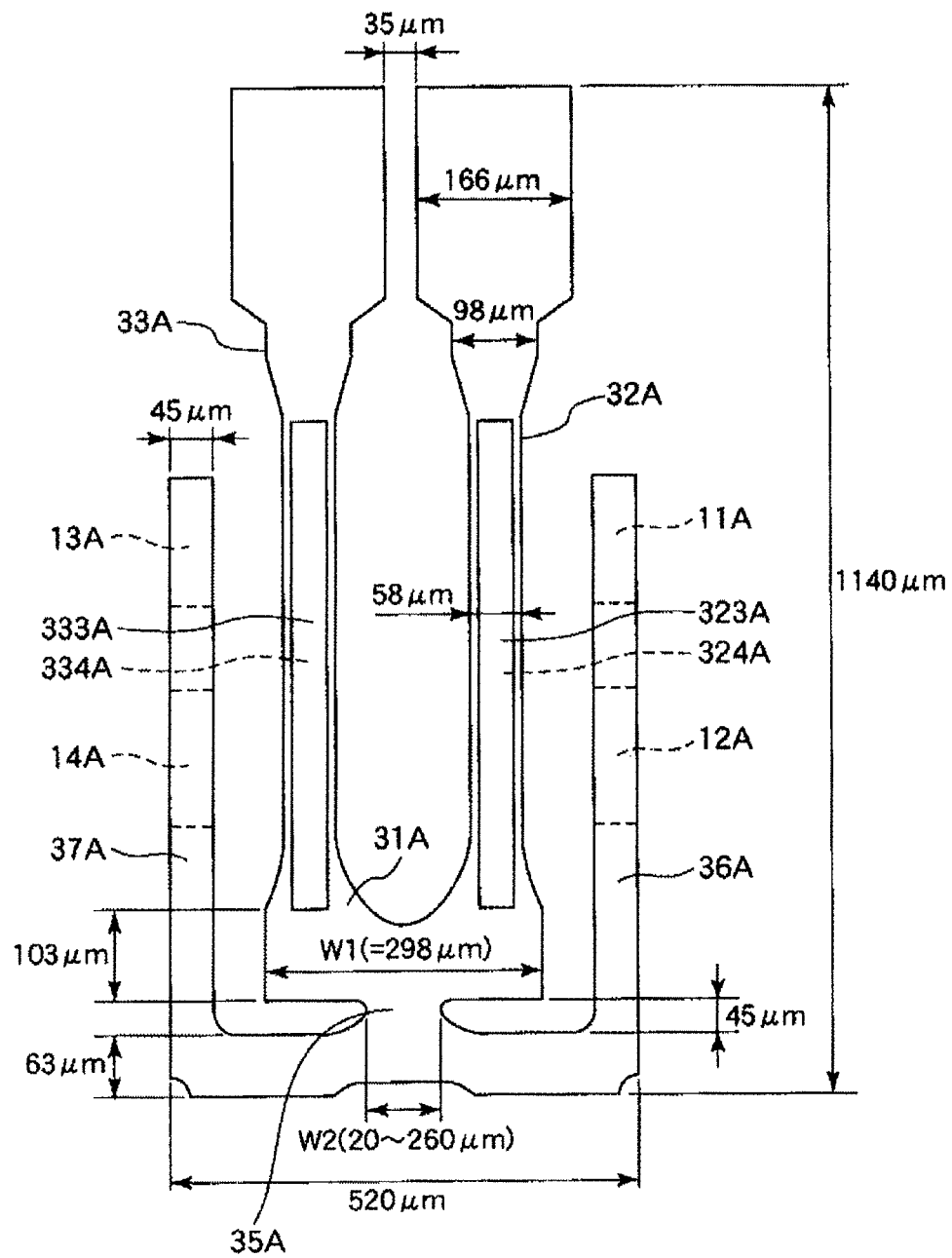
FIG. 8 is a plan view illustrating dimensions of a quartz crystal resonator blank using a simulation.
Figure 9:
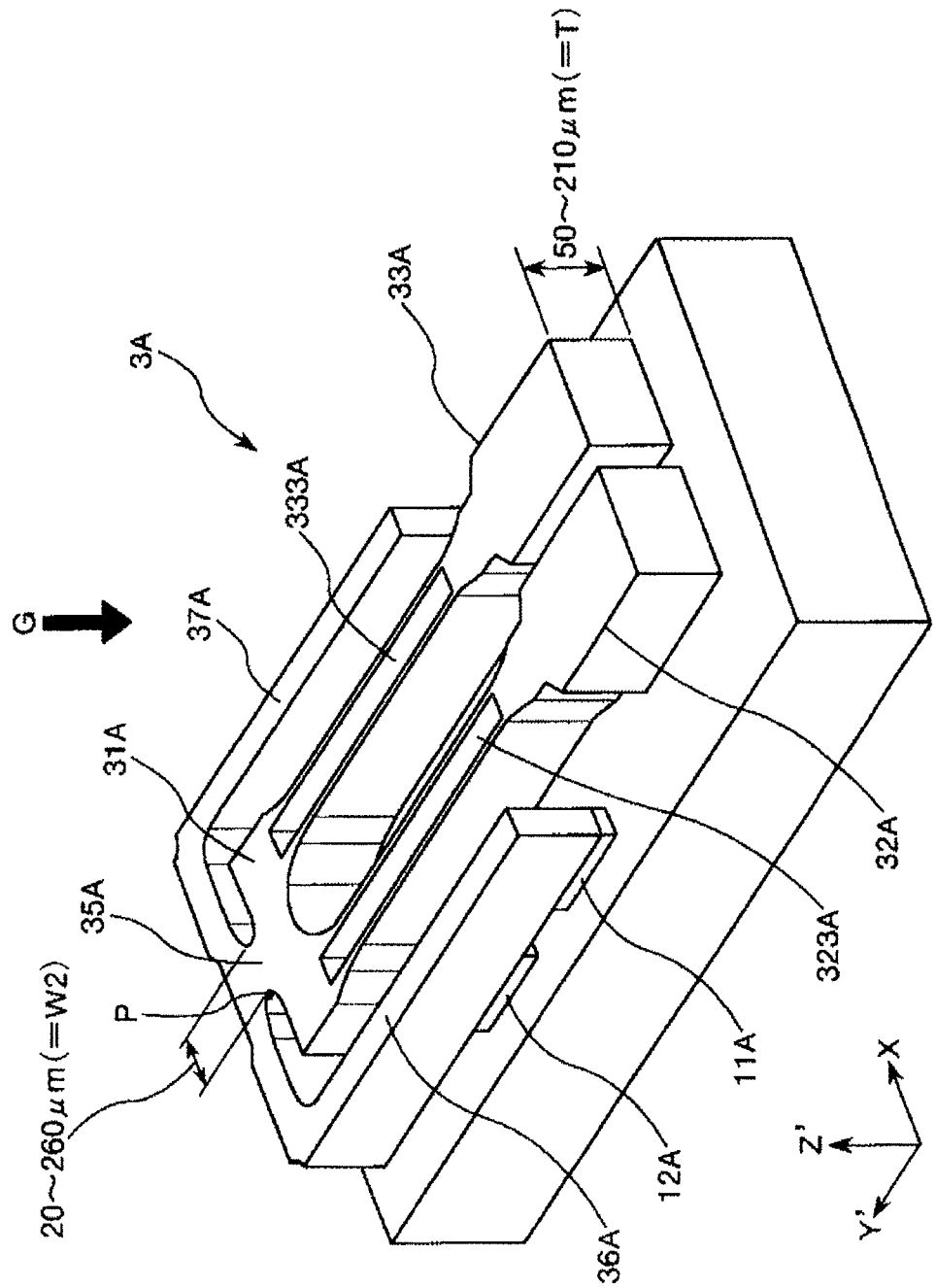
FIG. 9 is a perspective view illustrating a simulation method.
Figure 14:
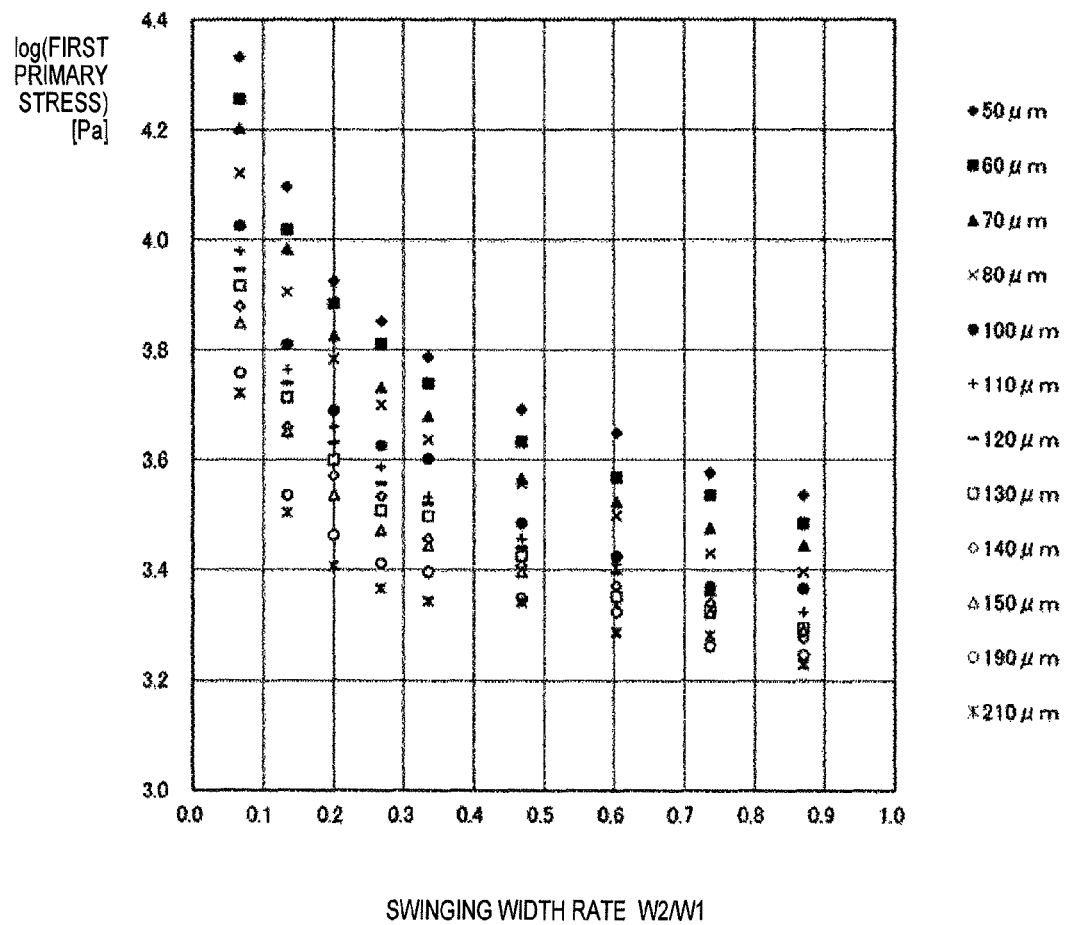
FIG. 14 is a graph illustrating a relationship between W2/W1 and log F.
Figure 15:
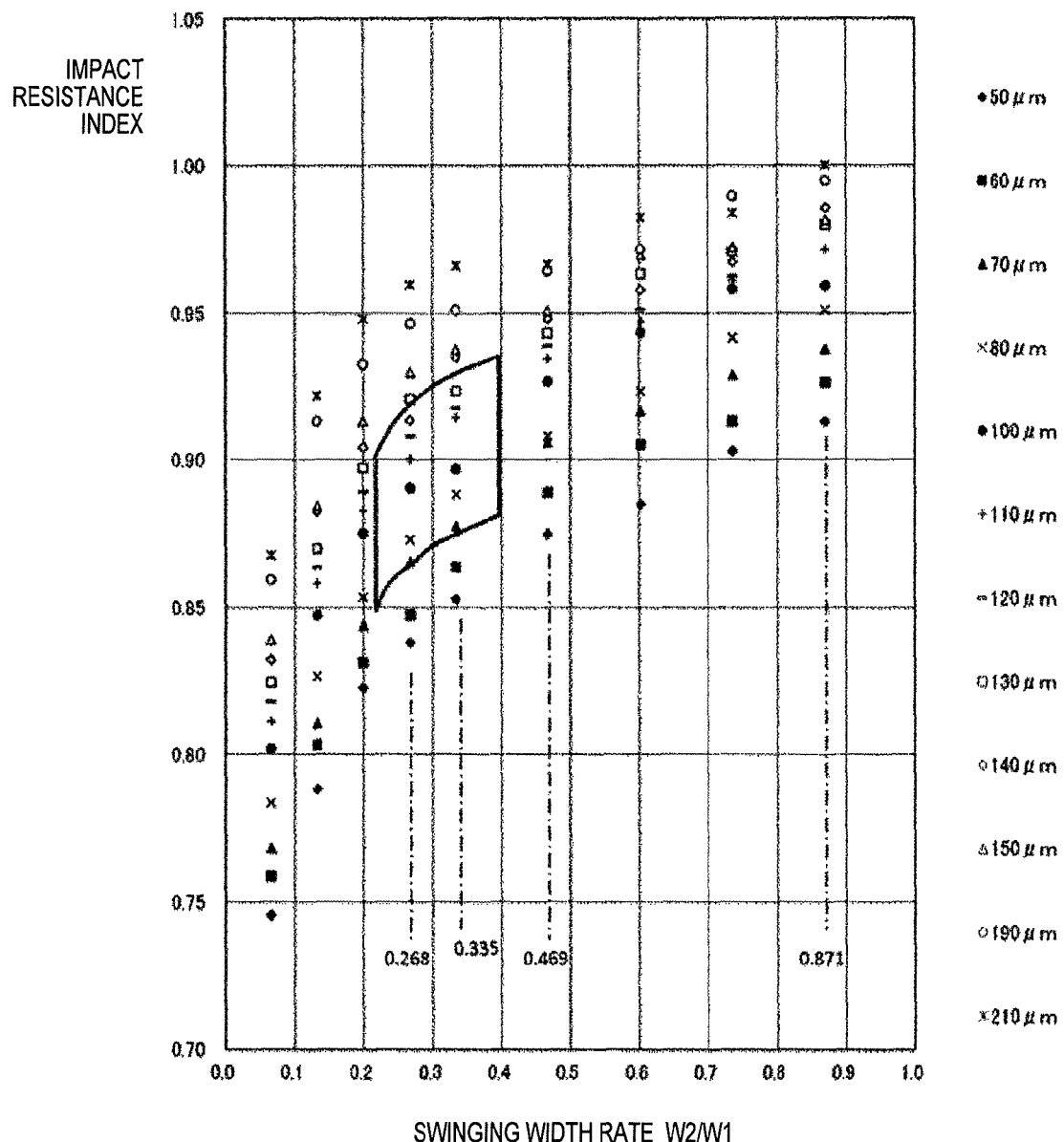
FIG. 15 is a graph illustrating a relationship between W2/W1 and an impact resistance index.

FIG. 1 is a plan view illustrating a resonator according to a preferred embodiment of the invention. FIG. 2 is a cross-sectional view taken along line A-A of FIG. 1. FIG. 3 is a cross-sectional view taken along line B-B of FIG. 1. FIG. 4 is a cross-sectional view illustrating a vibrating arm formed by wet etching. FIG. 5 is a cross-sectional view illustrating a vibrating arm regarding thermal conduction during flexural vibration. FIG. 6 is a graph illustrating a relationship between a Q value and f/fm. FIG. 7 is a perspective view illustrating a thickness T, and widths W1 and W2. FIG. 8 is a plan view illustrating dimensions of a quartz crystal resonator blank used in a simulation. FIG. 9 is a perspective view illustrating a simulation method. FIGS. 10 to 13 are tables illustrating simulation results, respectively. FIG. 14 is a graph illustrating a relationship between W2/W1 and log F. FIG. 15 is a graph illustrating a relationship between W2/W1 and an impact resistance index. Meanwhile, hereinafter, for convenience of description, the upper side of FIG. 2 is set to "top", and the lower side is set to "bottom". In addition, the upper side of FIG. 1 is set to "tip", and the lower side is set to "base end".

As shown in FIG. 1, a resonator 1 includes a resonator element 2 and a package 9 that stores the resonator element 2.

Package

As shown in FIGS. 1 and 2, the package 9 includes a box-like base 91 having a concave portion 911 which is opened in an upper surface, and a plate-like lid 92, bonded to a base 91, which blocks an opening of the concave portion 911. The package 9 has a housing space S formed by the concave portion 911 being blocked by the lid 92, and hermetically houses the resonator element 2 in the housing space S. An atmosphere within the housing space S is not particularly limited, but is preferably in a decompression state (vacuum state). Thereby, since air resistance against the drive of the resonator element 2 is reduced, it is possible to exhibit excellent vibration characteristics. Meanwhile, the degree of vacuum within the housing space S is not particularly limited, but is preferably approximately equal to or less than 100 Pa, and is more preferably approximately equal to or less than 10 Pa. In addition, an inert gas such as nitrogen, helium, or argon may be sealed in the housing space S.

The configuration material of the base 91 is not particularly limited, but various types of ceramics such as an aluminum oxide can be used as the material. In addition, the configuration material of the lid 92 is not particularly limited, but a member having a linear expansion coefficient approximate to that of the configuration material of the base 91 may be used as the material. For example, when ceramics as described above are used as the configuration material of the base 91, it is preferable to use an alloy such as Kovar. Meanwhile, the bonding of the base 91 to the lid 92 is not particularly limited, but the bonding can be performed, for example, with a metallization layer interposed therebetween.

In addition, connection terminals 951 and 961 are formed at the bottom of the concave portion 911 of the base 91. In addition, conductive adhesives 11 and 12 are provided on the connection terminal 951, and conductive adhesives 13 and 14 are provided on the connection terminal 961. The resonator element 2 is attached to the base 91 by these conductive adhesives 11 to 14. The connection terminal 951 is electrically connected to a first driving electrode 84 described later, and the connection terminal 961 is electrically connected to a second driving electrode 85 described later.

Meanwhile, the conductive adhesives 11 to 14 are not particularly limited as long as these adhesives have conductivity and adhesiveness, and a conductive adhesive obtained by mixing a conductive filler such as a silver particle with a resin such as an epoxy-based resin, an acrylic-based resin, a silicon-based resin, a polyimide-based resin, a bismaleimide-based resin, a polyester-based resin, and a polyurethane-based resin can be used. In this manner, by using a relatively soft adhesive, thermal stress occurring from, for example, the difference in thermal expansion coefficient between the base 91 and the resonator element 2 can be absorbed and relaxed by the conductive adhesives 11 to 14, and a deterioration or change in the vibration characteristics of the resonator element 2 can be reduced. Meanwhile, as long as the resonator element 2 can be attached to the base 91, a gold bump, solder or the like may be used in place of each of the conductive adhesives 11 to 14.

In addition, the connection terminal 951 is electrically connected to an external terminal 953 provided on the lower surface of the base 91 through a through-electrode 952 penetrating the bottom of the base 91, and similarly, the connection terminal 961 is electrically connected to an external terminal 963 provided on the lower surface of the base 91 through a through-electrode 962 penetrating the bottom of the base 91. The configurations of the connection terminals 951 and 961, the through-electrodes 952 and 963 and the external terminals 953 and 963 are not particularly limited as long as they have conductivity, and they can be configured such that a plated layer of Au (gold), Ag (silver), Cu (copper) or the like is formed on an underlying layer of, for example, Cr (chrome), Ni (nickel), W (tungsten), Mo (molybdenum) or the like.

Resonator Element

As shown in FIGS. 1 to 3, the resonator element 2 includes a quartz crystal resonator blank (resonator blank) 3, and first and second driving electrodes 84 and 85 which are formed on the quartz crystal resonator blank 3. Meanwhile, in FIGS. 1 and 2, for convenience of description, the first and second driving electrodes 84 and 85 are not shown in the drawings.

The quartz crystal resonator blank 3 is constituted by a Z cut quartz crystal plate. The Z cut quartz crystal plate is a quartz crystal substrate of which the Z-axis is set to a substantially thickness direction. Meanwhile, the quartz crystal resonator blank 3 may be configured such that the thickness direction thereof and the Z-axis are coincident with each other, but the Z-axis is slightly inclined with respect to the thickness direction from the viewpoint of reducing a frequency-temperature change in the vicinity of ordinary temperature. That is, when an inclined angle is set to θ ($-5° \le \theta \le 15°$) using the X-axis of an orthogonal coordinate system, composed of an X-axis as an electrical axis of the quartz crystal, a Y-axis as a mechanical axis, and a Z-axis as an optic axis, as the axis of rotation, and an axis obtained by inclining the Z-axis by θ so that the +Z side is rotated in the −Y direction of the Y-axis is set to a Z'-axis and an axis obtained by inclining the Y-axis by θ so that the +Y side is rotated in the +Z direction of the Z-axis is set to a Y'-axis, the quartz crystal resonator blank 3 is formed in which a direction along the Z'-axis is set to a thickness direction and a surface including the X-axis and the Y'-axis is set to a main surface. Meanwhile, in each drawing, the X-axis, the Y'-axis and the Z'-axis are shown.

In the quartz crystal resonator blank 3, the Y'-axis direction is set to a lengthwise direction, the X-axis direction is set to a widthwise direction, and the Z'-axis direction is a set to a thickness direction. In addition, the quartz crystal resonator blank 3 has substantially the same thickness over substantially the entire area thereof (excluding regions in which grooves 323, 324, 333, and 334 described later are formed). The thickness T of the quartz crystal resonator blank 3 is not particularly limited, but is preferably approximately equal to or greater than 50 μm and equal to or less than 210 μm. When the thickness is less than the above lower limit, there is a concern that the quartz crystal resonator blank 3 may be damaged due to a lack of a mechanical strength. When the thickness exceeds the above upper limit, a fine shape is not likely to be created by wet etching, which leads to an excessive increase in the size of the resonator element 2.

Such a quartz crystal resonator blank 3 includes a base portion 31, a pair of vibrating arms 32 and 33 which extend in a −Y'-axis direction from the end of the base portion 31 on the −Y'-axis side, a connecting portion 34, disposed on the +Y'-axis side of the base portion 31, which extends in an X-axis direction, a coupling portion 35, located between the base portion 31 and the connecting portion 34, which couples the base portion 31 to the connecting portion 34, and a pair of support arms 36 and 37 which extend in the −Y'-axis direction from both ends of the connecting portion 34. The base portion 31, the vibrating arms 32 and 33, the connecting portion 34, the coupling portion 35 and the support arms 36 and 37 are integrally formed.

The base portion 31 is formed in a plate shape having a width in the XY' plane and a thickness in the Z'-axis direction. The coupling portion 35 extends out in the +Y'-axis direction from the end of such a base portion 31 on the +Y'-axis side. The connecting portion 34 is connected to the end of the coupling portion 35 on the +Y'-axis side, and the connecting portion 34 extends from the coupling portion 35 to both sides in the X-axis direction. In addition, the support arm 36 extends out in the −Y'-axis direction from the end of the connecting portion 34 on the −X-axis side, and the support arm 37 extends out in the −Y'-axis direction from the end thereof on the +X-axis side. The support arms 36 and 37 are located outside the vibrating arms 32 and 33, and the vibrating arms 32 and 33 are disposed between the support arms 36 and 37. Meanwhile, the tips (ends on the −Y'-axis side) of the support arms 36 and 37 are located further on the +Y'-axis side than the tips (ends on the −Y'-axis side) of the vibrating arms 32 and 33.

The support arm 36 is attached to the base 91 by the conductive adhesives 11 and 12, and the support arm 37 is attached to the base 91 by the conductive adhesives 13 and 14. The conductive adhesives 11 and 12 are disposed separately from each other in the extending direction of the support arm 36, and the conductive adhesives 13 and 14 are disposed separately from each other in the extending direction of the support arm 37. In this manner, four conductive adhesives 11 to 14 are used, thereby allowing the resonator element 2 to be attached to the base 91 in a more stable state. In addition, it is preferable that at least a portion of the conductive adhesives 11 and 13 which are on the tip side are located further on the tip side than the centroid G' of the resonator element 2, and that at least a portion of the conductive adhesives 12 and 14 which are on the base end side are located further on the base end side than the centroid G'. Thereby, the resonator element 2 can be fixed to the base 91 in a more stable state.

Here, the coupling portion 35 has a width smaller than that of the base portion 31. In other words, the coupling portion 35 has a reduced width with respect to the base portion 31. In addition, it can also be said that the coupling portion 35 is formed at a position far enough away from the end of the base portion 31 on the vibrating arms 32 and 33 sides by forming cutout portions 31a and 31b which are formed at both edges by partially reducing the dimensions of the base portion 31 in a width direction. By providing such a coupling portion 35, it is possible to suppress the propagation of vibration leakage to the support arms 36 and 37 when the vibrating arms 32 and 33 are flexurally vibrated, and to keep a CI (crystal impedance) value which is an equivalent series resistance low. That is, the resonator element 2 having excellent vibration characteristics is formed by providing the coupling portion 35.

The vibrating arms 32 and 33 extend out in the −Y'-axis direction from the end of the base portion 31 on the −Y'-axis side so as to be lined up in the X-axis direction and be parallel to each other. Each of the vibrating arms 32 and 33 is formed in a longitudinal shape, and is configured such that the base end thereof (end on the +Y'-axis side) serves as a fixed end, and that the tip thereof (end on the −Y'-axis side) serves as a free end. In addition, each of the vibrating arms 32 and 33 includes arms 321 and 331 extending from the base portion 31, and hammerheads (large width portions) 322 and 332 as weight portions, provided at the tips of the arms 321 and 331, which have a width larger than that of the arms 321 and 331. In this manner, by providing the hammerheads 322 and 332 at the tip portions of the vibrating arms 32 and 33, it is possible to shorten the vibrating arms 32 and 33, and to achieve a reduction in the size of the resonator element 2. In addition, since the vibration velocity of the vibrating arms 32 and 33 when the vibrating arms 32 and 33 are vibrated at the same frequency can be made lower than in the related art to an extent that the vibrating arms 32 and 332 can be shortened, it is possible to reduce an air resistance when the vibrating arms 32 and 33 are vibrated, and to improve vibration characteristics due to an increase in Q value to that extent.

Hereinafter, the vibrating arms 32 and 33 will be described in detail. However, since the configurations of the vibrating arms 32 and 33 are the same as each other, the vibrating arm 32 will be representatively described below, and thus the description of the vibrating arm 33 will not be given below.

As shown in FIG. 3, the arm 321 includes a pair of main surfaces 32a and 32b, constituted by the XY' plane, which have a front-back relationship with each other, and a pair of lateral sides 32c and 32d, constituted by the Y' Z' plane, which connect a pair of main surfaces 32a and 32b. In addition, the arm 321 includes a bottomed groove 323 which is opened in the main surface 32a, and a bottomed groove 324 which is opened in the main surface 32b. In this manner, by forming the grooves 323 and 324 in the vibrating arm 32, it is possible to achieve a reduction in a thermo-elastic loss, and to exhibit excellent vibration characteristics. The length of the grooves 323 and 324 is not particularly limited, and the grooves may be configured such that the tips thereof extend to the hammerhead 322, and that the base ends thereof extend to the base portion 31. With such a configuration, the concentration of stress on a boundary portion between the arm 321 and the hammerhead 322 and a boundary portion between the arm 321 and the base portion 31 is relaxed, and a concern of fracture or breakage occurring when an impact is applied is reduced. Meanwhile, the groove may be formed in any one of the main surfaces 32a and 32b, and may be omitted.

It is preferable that the depth t of the grooves 323 and 324 satisfies the relation of $0.292 \leq t/T \leq 0.483$. Since a heat transfer path increases in length by satisfying such a relation, it is possible to achieve a reduction in a thermo-elastic loss more effectively in an adiabatic-like region described later. In addition, it is more preferable that the depth t satisfies the relation of $0.455 \leq t/T \leq 0.483$. Since a heat transfer path further increases in length by satisfying such a relation, it is possible to achieve a reduction in a thermo-elastic loss. Therefore, it is possible to realize a reduction in CI value associated with an improvement in Q value, and to realize a reduction in CI value due to an electrode area for applying an electric field to a region which is flexurally deformed being able to be further increased.

Meanwhile, when the quartz crystal resonator blank 3 is manufactured by patterning a quartz crystal substrate using wet etching, the arm 321 is formed in such a cross-sectional shape that the crystal plane of a quartz crystal is exposed as shown in FIG. 4. Specifically, since an etching rate in the −X-axis direction is lower than an etching rate in the +X-axis direction, the lateral side in the −X-axis direction has a relatively gentle inclination, and the lateral side in the +X-axis direction has an inclination close to a vertical state. The depth t of the grooves 323 and 324 in this case refers to a depth at the deepest position as shown in FIG. 4.

It is preferable that the grooves 323 and 324 are formed by adjusting a position in the X-axis direction with respect to the vibrating arm 32 so that the cross-sectional centroid of the vibrating arm 32 is coincident with the center of the cross-sectional shape of the vibrating arm 32. In this manner, since the unnecessary vibration (specifically, vibration having an out-of-plane direction component) of the vibrating arm 32 is reduced, it is possible to reduce vibration leakage. In addition, in this case, since the driving of the unnecessary vibration is reduced, it is possible to reduce a CI value due to a relative increase in a drive region.

The width (length in the X-axis direction) W3 of such an arm 321 is not particularly limited, but is preferably approximately equal to or greater than 16 μm and equal to or less than 300 μm, and is more preferably approximately equal to or greater than 45 μm and equal to or less than 60 μm. When the width W3 is less than the above lower limit, it is difficult to form the grooves 323 and 324 in the arm 321 depending on a manufacturing technique, and thus the vibrating arm 32 may not be able to serve as an adiabatic-like region. On the other hand, when the width W3 exceeds the above upper limit, the rigidity of the arm 321 becomes excessively high depending on the thickness of the quartz crystal resonator blank 3, and thus the flexural vibration of the arm 321 may not be able to be smoothly performed. Meanwhile, the width W3 as used herein refers to a width of a portion which is located at the central portion of the arm 321 and extends with a substantially constant width, and does not refer to a width of a tapered portion which is located at both ends.

In addition, when the total length (length in the Y'-axis direction) of the vibrating arm 32 is set to L, and the total length (length in the Y'-axis direction) of the hammerhead 322 is set to H, it is preferable to satisfy the relation of $0.183 \leq H/L \leq 0.597$, and to more preferable to satisfy the relation of 0.238≤H/L≤0.531. Thereby, the resonator element 2 is obtained in which both a reduction in size and an improvement in vibration characteristics are achieved. Meanwhile, the hammerhead 322 serves as a region having a width 1.5 times or more the width (length in the X-axis direction) of the arm 321. In addition, the base end of the vibrating arm 32 serves as the end point of a tapered portion which is located outside the base end of the vibrating arm 32.

In addition, the width (length in the X-axis direction) W4 of the hammerhead 322 is not particularly limited, but is preferably 2.8 times or more the width W3 of the arm 321. That is, it is preferable to satisfy the relation of W4≥2.8 W3. Thereby, it is possible to sufficiently exhibit the mass effect of the hammerhead 322, and to more effectively exhibit the above effect (achieve both a reduction in size and an improvement in vibration characteristics). Meanwhile, the hammerhead 322 of the present embodiment includes a base end 322*a* which is located on the base end side, and a tip portion 322*b*, located on the tip side of the base end 322*a*, which has a width larger than that of the base end 322*a*, and the width W4 refers to a width of the tip portion 322*b*.

As stated above, the shape of the quartz crystal resonator blank 3 has been described.

As shown in FIG. 3, a pair of first driving electrodes 84 and a pair of second driving electrodes 85 are formed in the vibrating arm 32 having such a quartz crystal resonator blank 3. One of the first driving electrodes 84 is formed in the inside of the groove 323, and the other is formed in the inside of the groove 324. In addition, one of the second driving electrodes 85 is formed on the lateral side 32*c*, and the other is formed on the lateral side 32*d*. Similarly, a pair of first driving electrodes 84 and a pair of second driving electrodes 85 are also formed in the vibrating arm 33. One of the first driving electrodes 84 is formed on the lateral side 33*c*, and the other is formed on the lateral side 33*d*. In addition, one of the second driving electrodes 85 is formed in the inside of the groove 333, and the other is formed in the inside of the groove 334. Each of the first driving electrodes 84 is extracted up to the support arm 36 by a wiring (not shown), and is electrically connected to the connection terminal 951 through the conductive adhesives 11 and 12. Similarly, each of the second driving electrodes 85 is extracted up to the support arm 37 by a wiring (not shown), and is electrically connected to the connection terminal 961 through the conductive adhesives 13 and 14. When an alternating voltage is applied between these first and second driving electrodes 84 and 85, the vibrating arms 32 and 33 are vibrated at a predetermined frequency in the X-axis direction (in-plane direction) so as to approach each other and be separated from each other repeatedly.

The configuration material of the first and second driving electrodes 84 and 85 is not particularly limited as long as it has conductivity, and the driving electrodes can be configured such that a coating layer of Au (gold), Ag (silver), Cu (copper) or the like is formed on an underlying layer of, for example, Cr (chrome), Ni (nickel), W (tungsten), Mo (molybdenum) or the like.

In addition, the specific configuration of the first and second driving electrodes 84 and 85 can include, for example, a configuration in which an Au layer of 700 Å or less is formed on a Cr layer of 700 Å or less. Particularly, since Cr and Au have a large thermo-elastic loss, the Cr layer and the Au layer are preferably 200 Å or less in thickness. In addition, when an insulation breakdown resistance is increased, the Cr layer and the Au layer are preferably 1,000 Å or more in thickness. Further, since Ni has a thermal expansion coefficient close to that of a quartz crystal, a Ni layer is formed as an underlying layer in place of the Cr layer, and thus it is possible to reduce thermal stress caused by the electrode, and to obtain a resonator element having good long-term reliability (aging characteristics).

As stated above, the configuration of the resonator element 2 has been described. As described above, the grooves 323, 324, 333, and 334 are formed in each of the vibrating arms 32 and 33 of the resonator element 2, and thus it is possible to achieve a reduction in a thermo-elastic loss, and to exhibit excellent vibration characteristics. Hereinafter, regarding the above, the vibrating arm 32 will be specifically described by way of example.

As stated above, the vibrating arm 32 is flexurally vibrated in an in-plane direction by applying an alternating voltage between the first and second driving electrodes 84 and 85. As shown in FIG. 5, during this flexural vibration, the contraction of the lateral side 32*c* of the arm 321 causes the lateral side 32*d* to expand, and on the contrary, the expansion of the lateral side 32*c* causes the lateral side 32*d* to contract. When the vibrating arm 32 does not bring about the Gough-Joule effect (energy elasticity is dominant over entropy elasticity), the temperature of the contracting lateral side out of the lateral sides 32*c* and 32*d* rises, and the temperature of the expanding lateral side drops. For this reason, a temperature difference occurs between the lateral side 32*c* and the lateral side 32*d*, that is, in the inside of the arm 321. The loss of vibration energy occurs due to thermal conduction resulting from this temperature difference, whereby the Q value of the resonator element 2 is reduced. The loss of energy associated with such a reduction in the Q value is also called a thermo-elastic loss.

In a resonator element vibrating in a flexural vibration mode which has such a configuration as the resonator element 2, when the flexural vibration frequency (mechanical flexural vibration frequency) f of the vibrating arm 32 changes, and the flexural vibration frequency of the vibrating arm 32 is coincident with the thermal relaxation frequency fm, the Q value is minimized. This thermal relaxation frequency fm can be obtained by the following Expression (1). In Expression (1), n is the ratio of the circumference of a circle to its diameter, and τ is a relaxation time required for the temperature difference to be set to be $e^{-1}$ times due to thermal conduction when e is set to the Napier's constant.

$$fm = \frac{1}{2\pi\tau} \quad (1)$$

In addition, when the thermal relaxation frequency of a flat-plate structure (structure of which the cross-sectional shape is rectangular) is set to fm0, fm0 can be obtained by the following Expression (2). Meanwhile, in Expression (2), π is the ratio of the circumference of a circle to its diameter, k is the thermal conductivity of the vibrating arm 32 in a vibration direction, ρ is the mass density of the vibrating arm 32, Cp is the thermal capacity of the vibrating arm. 32, and a is the width of the vibrating arm 32 in a vibration direction. When the constant of the material itself (that is, quartz crystal) of the vibrating arm. 32 is input to the thermal conductivity k, the mass density ρ, and the thermal capacity Cp of Expression (2), the obtained thermal relaxation frequency fm0 is equal to a value when the vibrating arm 32 is not provided with the grooves 323 and 324.

$$fm0 = \frac{\pi k}{2\rho C p a^2} \quad (2)$$

In the vibrating arm 32, the grooves 323 and 324 are formed so as to be located between the lateral sides 32c and 32d. For this reason, a heat transfer path for performing temperature equilibrium through thermal conduction on the temperature difference between the lateral sides 32c and 32d which occurs during the flexural vibration of the vibrating arm 32 is formed so as to go around the grooves 323 and 324, and the heat transfer path becomes longer than the straight-line distance (shortest distance) between the lateral sides 32c and 32d. For this reason, as compared to a case where the vibrating arm 32 is not provided with the grooves 323 and 324, the relaxation time τ becomes longer, and the thermal relaxation frequency fm becomes lower.

FIG. 6 is a graph illustrating f/fm dependency of the Q value of a resonator element in a flexural vibration mode. In the drawing, curve F1 shown by a dotted line illustrates a case where the groove is formed in the vibrating arm as in the resonator element 2, and curve F2 shown by a solid line illustrates a case where the groove is not formed in the vibrating arm. As shown in the drawing, the shapes of curves F1 and F2 do not change, but curve F1 shifts in the direction of frequency drop with respect to curve F2, in association with a drop in thermal relaxation frequency fm as described above. Therefore, when the thermal relaxation frequency in a case where the groove is formed in the vibrating arm as in the resonator element 2 is set to fm1, the following Expression (3) is satisfied, and thus the Q value of the resonator element in which the groove is formed in the vibrating arm always becomes larger than the Q value of the resonator element in which the groove is not formed in the vibrating arm.

$$f > \sqrt{fm0 fm1} \quad (3)$$

Further, when a limitation to the relation of the following Expression (4) is made, a higher Q value can be obtained.

$$\frac{f}{fm0} > 1 \quad (4)$$

Meanwhile, in FIG. 6, a region having a relation of f/fm<1 is also called an isothermal-like region, and in this isothermal-like region, the Q value becomes larger as f/fm becomes smaller. This is because the temperature difference within the vibrating arm as described above is not more likely to occur as the mechanical frequency of the vibrating arm becomes lower (the vibration of the vibrating arm becomes slower). Therefore, in the limit when f/fm is brought infinitely close to 0 (zero), an isothermal quasi-static process is used, and a thermo-elastic loss comes infinitely close to 0 (zero). On the other hand, a region of f/fm>1 is also called an adiabatic-like region, and in this adiabatic-like region, the Q value becomes larger as f/fm becomes larger. This is because, as the mechanical frequency of the vibrating arm becomes higher the switching of the temperature rise and temperature drop on each lateral side speeds up, and the time for the thermal conduction as described above to occur runs out. Therefore, in the limit when f/fm is infinitely increased, an adiabatic process is used, and a thermo-elastic loss comes infinitely close to 0 (zero).

From this, it can be said, in other words, that the satisfaction of the relation of f/fm>1 refers to the location of f/fm at the adiabatic-like region.

As stated above, a thermo-elastic loss has been described.

In such a resonator element 2, the relationship between the thickness (length in the Z'-axis direction) T of the quartz crystal resonator blank 3 shown in FIG. 7, the width (length in the X-axis direction) W1 of the base portion 31, and the width (length in the X-axis direction) W2 of the coupling portion 35 is set to any of the following pattern 1, pattern 2, and pattern 3, thereby allowing the resonator element 2 having excellent vibration characteristics and excellent impact resistance to be formed. That is, as stated above, reduction in vibration leakage and an improvement of vibration characteristics can be achieved by providing the coupling portion 35. Further, the resonator element 2 having excellent impact resistance can be formed by using any of the following pattern 1, pattern 2, and pattern 3. Meanwhile, the width W2 of the coupling portion 35 refers to a width in a portion of which the width becomes smallest. Meanwhile, both the width W1 of the base portion 31 and the width W2 of the coupling portion 35 are assumed to be specified by the contour portions of the main surfaces of two sides.

Pattern 1

In the pattern 1, the thickness T satisfies the relation of 110 μm≤T≤210 μm, and the widths W1 and W2 satisfy the relation of 0.469≤W2/W1≤0.871.

Pattern 2

In the pattern 2, the thickness T satisfies the relation of 130 μm≤T≤210 μm, and the widths W1 and W2 satisfy the relation of 0.469≤W2/W1≤0.871.

Pattern 3

In the pattern 3, the thickness satisfies the relation of 150 μm≤T≤210 μm, and the widths satisfy the relation of 0.268≤W2/W1≤0.335.

Hereinafter, it is proved that the resonator element 2 having excellent impact resistance is obtained by satisfying any of the patterns 1, 2, and 3, on the basis of simulation results performed by the inventor. Meanwhile, a quartz crystal resonator blank 3A used in this simulation is formed by patterning a Z cut quartz crystal plate using wet etching, and has dimensions shown in FIG. 8. Each of grooves 323A, 324A, 333A, and 334A has a depth of 45% of the thickness T of the quartz crystal resonator blank 3A.

Meanwhile, in this simulation, since the quartz crystal resonator blank 3A patterned by wet etching is used, the grooves 323A, 324A, 333A, and 334A which are formed in vibrating arms 32A and 33A are formed in a shape in which the crystal plane of a quartz crystal as shown in FIG. 4 appears. In addition, the first and second driving electrodes 84 and 85, and other wirings are not formed in the quartz crystal resonator blank 3A used in this simulation. In addition, it is confirmed by the inventor that even when the dimensions of respective portions are different from each other, there is little difference from this simulation results (there is the same tendency as in the results).

As shown in FIG. 9, in this simulation, in a state where the quartz crystal resonator blank 3A having a thickness T of 50 μm to 210 μm (T=50 μm, 60 μm, 70 μm, 80 μm, 100 μm, 110 μm, 120 μm, 130 μm, 140 μm, 150 μm, 190 and 210 μm) and a width W2 of 20 μm to 260 μm (20 μm, 40 μm, 60 μm, 80 μm, 100 μm, 140 μm, 180 μm, 220 μm, and 260 μm) was fixed to the base using conductive adhesives 11A, 12A, 13A, and 14A (herein, 13A and 14A are not shown) at two support arms 36A and 37A, an acceleration G of 1 G was applied to the quartz crystal resonator blank 3A in the −Z'-axis direction, and a first main stress F applied to a portion shown by a point P of FIG.

9 when the acceleration G was applied was calculated. Meanwhile, the portion shown by the point P is a portion on which most of stress is concentrated in the coupling portion 35A when the acceleration G is applied. In addition, it is confirmed by the inventor that even when the acceleration larger than 1 G is applied, the magnitude relation of the first main stress F remains unchanged, and there is the same tendency as in this simulation results.

Meanwhile, as each of the conductive adhesives 11A to 14A, a bismaleimide-based adhesive having a thickness=20 µm, a Young's modulus=3.4 GPa, a Poisson's ratio=0.33, and a mass density=4,070 kg/m³ is used.

The above-mentioned simulation results are shown in FIGS. 10 to 14. FIGS. 10 to 13 are tables illustrating the above simulation results, and FIG. 14 is a graph obtained by plotting numerical values shown in FIGS. 10 to 13. The vertical axis of FIG. 14 is the logarithm (log F) of the first main stress F, and the horizontal axis is W2/W1. As can be understood from FIGS. 10 to 14, in a case of all the thicknesses T, the first main stress F applied to the point P has a tendency to become smaller as W2/W1 comes closer to 1.0 (that is, as the width of the coupling portion 35A becomes larger). That is, as W2/W1 comes closer to 1.0, the impact resistance (mechanical strength) of the quartz crystal resonator blank 3A has a tendency to improve.

Next, FIG. 15 shows a graph obtained by plotting an impact resistance index in which the reciprocal number of each log F is taken, and the maximum value of the reciprocal number is specified as "1". The vertical axis of FIG. 15 is an impact resistance index, and the horizontal axis is W2/W1. In FIG. 15, it is shown that as the impact resistance index is closer to 1.0, the impact resistance is higher. In addition, in FIG. 15, 70 µm≤T≤130 which is a range disclosed in the related art (JP-A-2008-72705 stated above) is satisfied, and a range in which the relation of 0.23≤W2/W1≤0.40 is satisfied is surrounded by a frame. In this manner, the region having more excellent impact resistance than in the related art becomes obvious by showing the frame.

From FIGS. 11 to 13 and FIG. 15, when the thickness T is 110 µm≤T≤210 µm, it can be understood that in the range of 0.469≤W2/W1≤0.871, the impact resistance index is higher than that of an existing quartz crystal resonator blank. Therefore, as in the above-mentioned pattern 1, when the relation of 110 µm≤T≤210 µm is satisfied, and the relation of 0.469≤W2/W1≤0.871 is satisfied, it is proved that a quartz crystal resonator blank having more excellent impact resistance than in the related art is obtained.

In addition, when the thickness T is 130 µm≤T≤210 µm, it can be understood that in the range of 0.469≤W2/W1≤0.871, the impact resistance index is higher than that of an existing quartz crystal resonator blank. Therefore, as in the above-mentioned pattern 2, when the relation of 130 µm≤T≤210 µm is satisfied, and the relation of 0.469≤W2/W1≤0.871 is satisfied, it is proved that a quartz crystal resonator blank having more excellent impact resistance than in the related art is obtained.

In addition, when the thickness T is 150 µm≤T≤210 µm, it can be understood that in the range of 0.268≤W2/W1≤0.335, the impact resistance index is higher than an existing quartz crystal resonator blank. Therefore, as in the above-mentioned pattern 3, when the relation of 150 µm≤T≤210 µm is satisfied, and the relation of 0.268≤W2/W1≤0.335 is satisfied, it is proved that a quartz crystal resonator blank having more excellent impact resistance than in the related art is obtained.

From the above, the resonator element 2 having excellent impact resistance is obtained by satisfying any of the above patterns 1, 2, and 3. As stated above, since excellent vibration characteristics can be exhibited by being provided with the coupling portion 35, the resonator element having both excellent vibration characteristics and excellent impact resistance is formed by satisfying any of the above patterns 1, 2, and 3.

2. Oscillator

Next, an oscillator including the resonator element according to the invention will be described.

Figure 16:
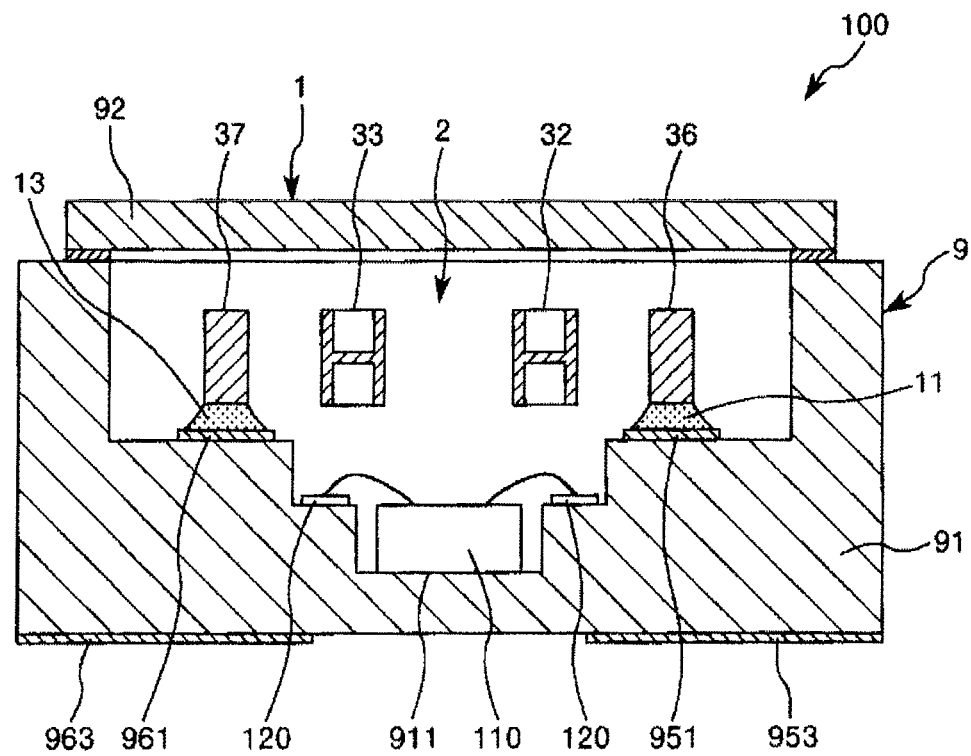
FIG. 16 is a cross-sectional view illustrating a preferred embodiment of an oscillator according to the invention.

FIG. 16 is a cross-sectional view illustrating a preferred embodiment of an oscillator according to the invention.

An oscillator 100 shown in FIG. 16 includes the resonator 1, and an IC chip 110 for driving the resonator element 2. Hereinafter, the oscillator 100 will be described with focus on a difference from the aforementioned resonator, and the description of the same particulars will not be given below.

As shown in FIG. 16, in the oscillator 100, the IC chip 110 is fixed to the concave portion 911 of the base 91. The IC chip 110 is electrically connected to a plurality of internal terminals 120 formed at the bottom of the concave portion 911. The plurality of internal terminals 120 include elements connected to the connection terminals 951 and 961, and elements connected to the external terminals 953 and 963. The IC chip 110 includes an oscillation circuit (circuit) for controlling the drive of the resonator element 2. When the resonator element 2 is driven by the IC chip 110, a signal having a predetermined frequency can be extracted.

3. Electronic Device

Next, an electronic device including the resonator element according to the invention will be described.

Figure 17:
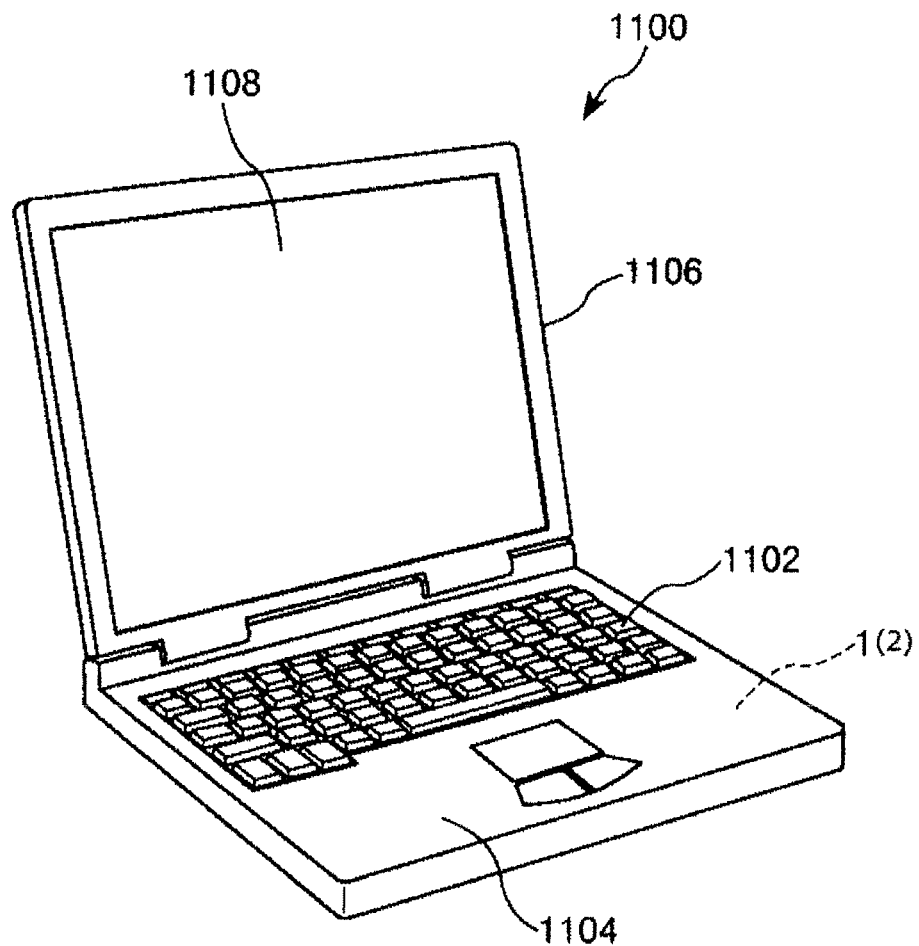
FIG. 17 is a perspective view illustrating a configuration of a personal computer of a mobile type (or note type) to which an electronic device according to the invention is applied.

FIG. 17 is a perspective view illustrating a configuration of a mobile type (or note type) personal computer to which the electronic device according to the invention is applied. In this drawing, a personal computer 1100 is constituted by a main body 1104 including a keyboard 1102 and a display unit 1106 including a display portion 1108, and the display unit 1106 is rotatably supported with respect to the main body 1104 through a hinge structure. Such a personal computer 1100 has the built-in resonator 1 (resonator element 2) functioning as a filter, a resonator, a reference clock, or the like.

Figure 18:
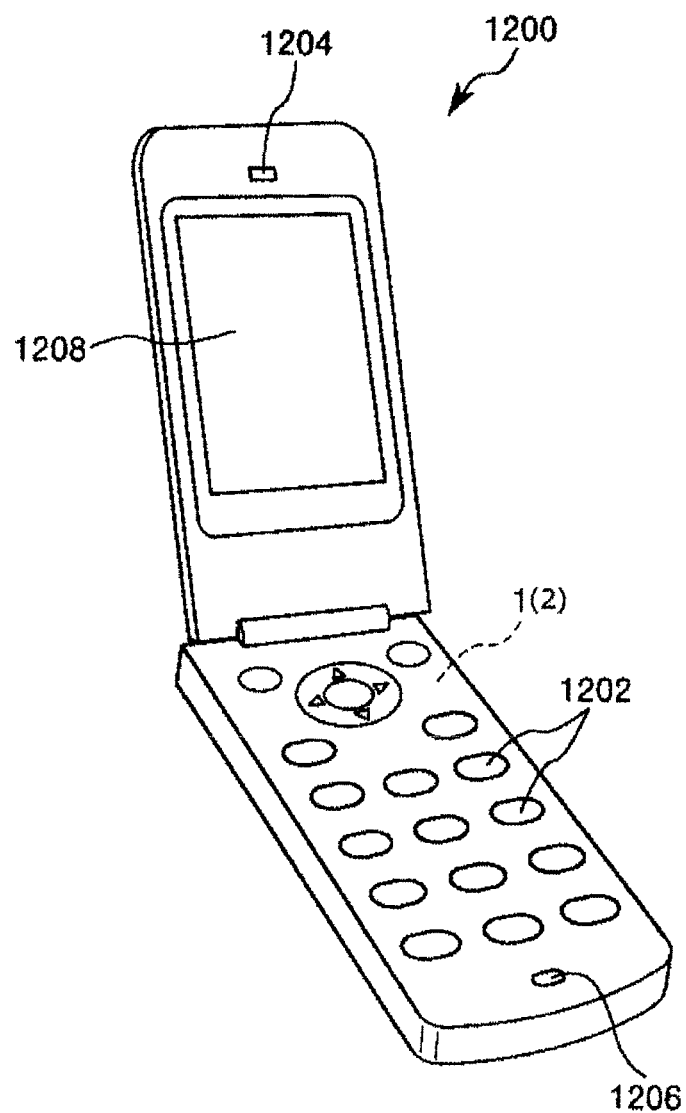
FIG. 18 is a perspective view illustrating a configuration of a cellular phone (also including PHS) to which an electronic device according to the invention is applied.

FIG. 18 is a perspective view illustrating a configuration of a cellular phone (also including PHS) to which the electronic device according to the invention is applied. In this drawing, a cellular phone 1200 includes a plurality of operation buttons 1202, an ear piece 1204 and a mouth piece 1206, and a display portion 1208 is disposed between the operation buttons 1202 and the ear piece 1204. Such a cellular phone 1200 has the built-in resonator 1 (resonator element 2) functioning as a filter, a resonator, a reference clock, or the like.

Figure 19:
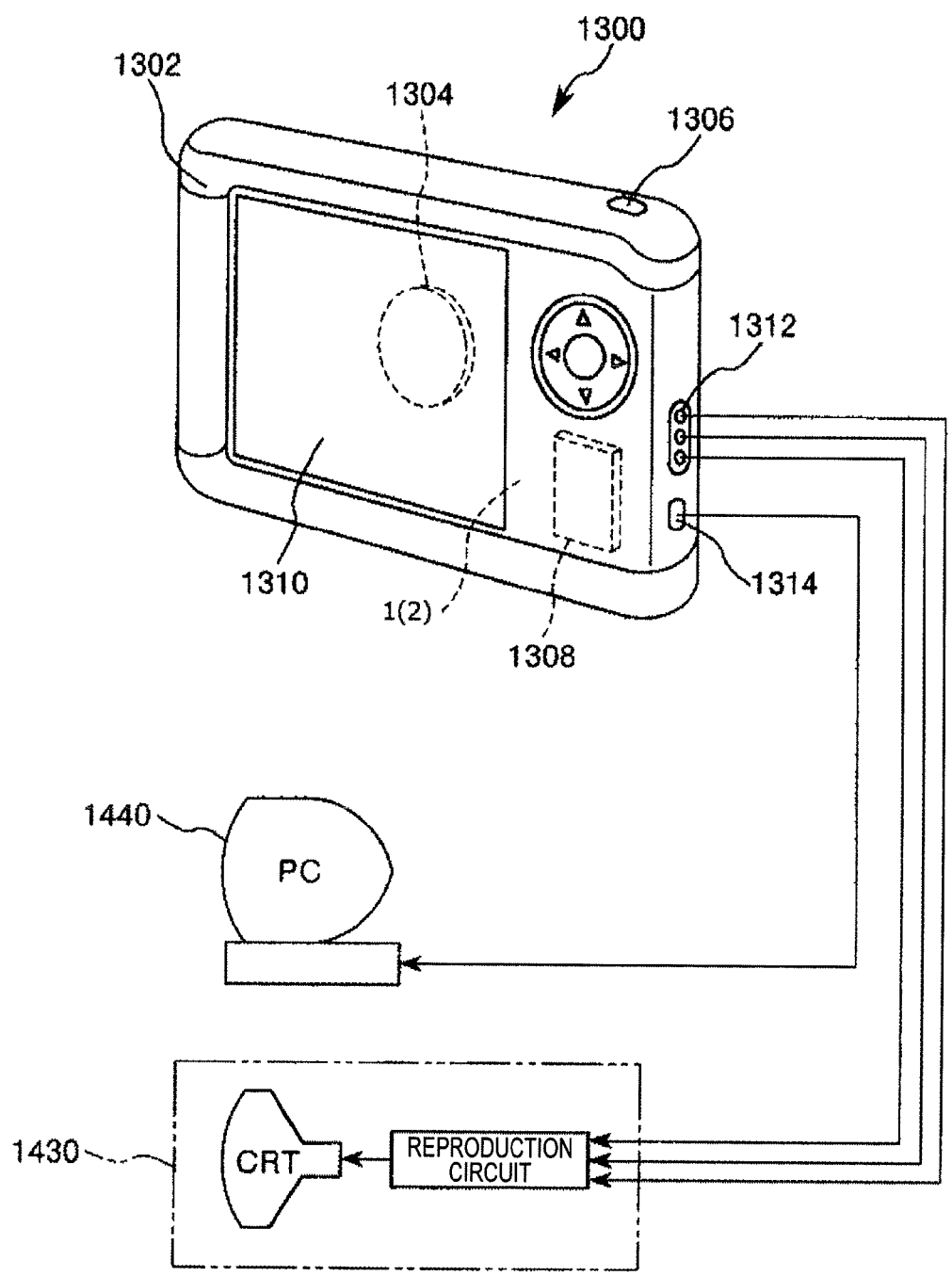
FIG. 19 is a perspective view illustrating a configuration of a digital still camera to which an electronic device according to the invention is applied.

FIG. 19 is a perspective view illustrating a configuration of a digital still camera to which the electronic device according to the invention is applied. Meanwhile, in the drawing, the connection with an external device is also shown simply. Here, a normal camera exposes a silver halide photo film through a light image of a subject, whereas a digital still camera 1300 generates an imaging signal (image signal) by photoelectrically converting a light image of a subject using an imaging device such as a CCD (Charge Coupled Device).

A display portion 1310 is provided on the rear of a case (body) 1302 in the digital still camera 1300, and is configured to perform a display on the basis of an imaging signal of a CCD. The display portion functions as a viewfinder for displaying a subject as an electronic image. In addition, a light-receiving unit 1304 including an optical lens (imaging optical system), a CCD and the like is provided on the front side (back side in the drawing) of the case 1302.

When a photographer confirms a subject image displayed on the display portion and pushes a shutter button 1306, an imaging signal of the CCD at that point in time is transmitted and stored to and in a memory 1308. In addition, in the digital still camera 1300, a video signal output terminal 1312 and an input and output terminal 1314 for data communication are provided on the lateral side of the case 1302. As shown in the drawing, a TV monitor 1430 is connected to the video signal output terminal 1312 and a personal computer 1440 is connected to the input and output terminal 1314 for data communication, respectively as necessary. Further, the imaging signal stored in the memory 1308 is output to the TV monitor 1430 or the personal computer 1440 by a predetermined operation. Such a digital still camera 1300 has the built-in resonator 1 (resonator element 2) functioning as a filter, a resonator, a reference clock, or the like.

Meanwhile, in addition to the personal computer (mobile type personal computer) of FIG. 17, the cellular phone of FIG. 18, and the digital still camera of FIG. 19, the electronic device including the resonator element according to the invention can be applied to, for example, an ink jet ejecting apparatus (for example, ink jet printer), a laptop personal computer, a television, a video camera, a video recorder, a car navigation device, a pager, an electronic notebook (also including a communication function), an electronic dictionary, an electronic calculator, an electronic game console, a word processor, a workstation, a TV phone, a security TV monitor, an electronic binoculars, a POS terminal, medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), a flight simulator, and the like.

4. Mobile Object

Next, a mobile object including the resonator element according to the invention will be described.

Figure 20:
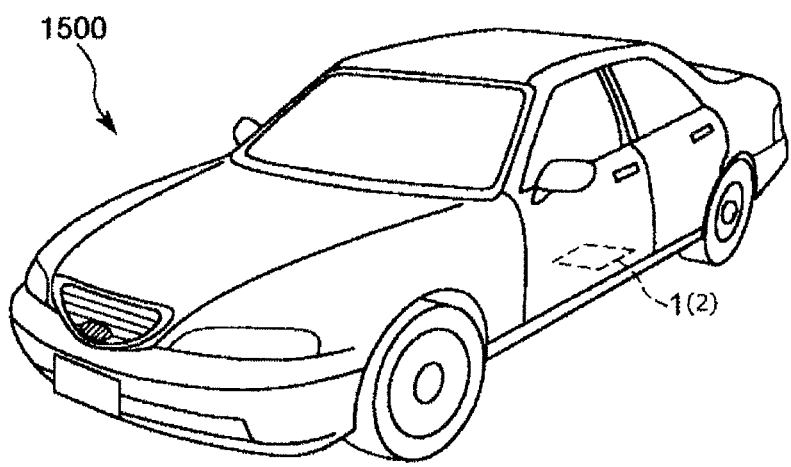
FIG. 20 is a perspective view illustrating an automobile to which a mobile object according to the invention is applied.

FIG. 20 is a perspective view illustrating an automobile to which the mobile object according to the invention is applied. The resonator 1 (resonator element 2) is mounted to an automobile 1500. The resonator 1 can be applied widely to, for example, electronic control units (ECUs) such as a keyless entry, an immobilizer, a car navigation system, a car air conditioner, an antilock brake system (ABS), an air bag, a tire pressure monitoring system (TPMS), engine control, a battery monitor of a hybrid automobile or an electric automobile, and a car-body posture control system.

As stated above, the resonator element, the resonator, the oscillator, the electronic device and the mobile object according to the invention have been described on the basis of the shown embodiments, but the invention is not limited thereto, and the configuration of each portion can be replaced by any configuration having the same function. In addition, any other configurations may be added to the invention. In addition, the respective embodiments may be appropriately combined.

The entire disclosure of Japanese Patent Application No. 2013-237475, filed Nov. 16, 2013 is expressly incorporated by reference herein.

What is claimed is:

1. A resonator element comprising a resonator blank which is provided with:
  a base portion;
  a vibrating arm that extends out in a first direction from one end side of the base portion, when seen in plan view;
  a connecting portion which is disposed on the other end side of the base portion, when seen in plan view; and
  a coupling portion, located between the base portion and the connecting portion when seen in plan view, which couples the base portion to the connecting portion,
  wherein when a thickness of the resonator blank is set to T,
  a width of the base portion along a second direction intersecting the first direction is set to W1, and
  a width of the coupling portion along the second direction is set to W2,
  a relation of 110 µm≤T≤210 µm is satisfied,
  a relation of 0.469≤W2/W1≤0.871 is satisfied,
  the vibrating arm includes:
    a weight portion; and
    an arm which is disposed between the base portion and the weight portion when seen in plan view, and
    the weight portion having a width along the second direction being 2.8 times or more than a width of the arm.

2. The resonator element according to claim 1, wherein a relation of 130 µm≤T≤210 µm is satisfied.

3. A resonator comprising:
  the resonator element according to claim 2; and
  a package in which the resonator element is stored.

4. An oscillator comprising:
  the resonator element according to claim 2; and
  a circuit.

5. An electronic device comprising the resonator element according to claim 2.

6. A mobile object comprising the resonator element according to claim 2.

7. The resonator element according to claim 1,
  wherein the connecting portion extends out along the second direction; and
  the resonator element further comprising a support arm connected to the connecting portion, which extends out along the first direction.

8. The resonator element according to claim 1, wherein a groove is provided in at least one of a first main surface and a second main surface of the vibrating arm which have a front-back relationship with each other.

9. A resonator comprising:
  the resonator element according to claim 1; and
  a package in which the resonator element is stored.

10. An oscillator comprising:
  the resonator element according to claim 1; and
  a circuit.

11. An electronic device comprising the resonator element according to claim 1.

12. A mobile object comprising the resonator element according to claim 1.

13. A resonator element comprising a resonator blank which is provided with:
  a base portion;
  a vibrating arm that extends out in a first direction from one end side of the base portion, when seen in plan view;
  a connecting portion which is disposed on the other end side of the base portion, when seen in plan view; and
  a coupling portion, located between the base portion and the connecting portion when seen in plan view, which couples the base portion to the connecting portion,
  wherein when a thickness of the resonator blank is set to T,
  a width of the base portion along a second direction intersecting the first direction is set to W1, and
  a width of the coupling portion along the second direction is set to W2,
  a relation of 150 µm<T≤210 µm is satisfied,
  a relation of 0.268≤W2/W1≤0.335 is satisfied,
  the vibrating arm includes:
    a weight portion; and
    an arm which is disposed between the base portion and the weight portion when seen in plan view, and the weight portion having a width along the second direction being 2.8 times or more than a width of the arm.

14. A resonator comprising:
the resonator element according to claim 13; and
a package in which the resonator element is stored.

15. An oscillator comprising:
the resonator element according to claim 13; and
a circuit.

16. An electronic device comprising the resonator element according to claim 13.

17. A mobile object comprising the resonator element according to claim 13.

* * * * *